United States Patent [19]

Gaw et al.

[11] Patent Number: 4,989,050
[45] Date of Patent: Jan. 29, 1991

[54] SELF ALIGNED, SUBSTRATE EMITTING LED

[75] Inventors: Craig A. Gaw, Scottsdale; Curtis D. Moyer, Phoenix, both of Ariz.

[73] Assignee: Motorola, Inc., Schaumburg, Ill.

[21] Appl. No.: 399,049

[22] Filed: Aug. 28, 1989

[51] Int. Cl.$^5$ .............................................. H01L 33/00
[52] U.S. Cl. ........................................ 357/17; 357/16; 357/56
[58] Field of Search ...................... 357/17, 16, 56, 61, 357/4

[56] References Cited

U.S. PATENT DOCUMENTS

| 4,212,020 | 7/1980 | Yariv et al. | 357/17 |
| 4,575,852 | 3/1986 | Fujimoto et al. | 357/16 |
| 4,630,083 | 12/1986 | Yamakoshi | 357/17 |

FOREIGN PATENT DOCUMENTS

| 0067586 | 12/1982 | Japan | 357/17 |
| 0170093 | 10/1983 | Japan | 357/17 |
| 0155978 | 9/1984 | Japan | 357/17 |
| 0232669 | 10/1986 | Japan | 357/17 |
| 0060278 | 3/1987 | Japan | 357/17 |
| 0155781 | 6/1988 | Japan | 357/17 |

OTHER PUBLICATIONS

Zipperian et al., "InGaAs/GaAs . . . IC Applications", IEEE, 12/9/84, pp. 524–527.
Namizaki et al., "Transverse-Junction-Stripe-Geometry Double-Heterostructure . . . Current", Journal of Applied Physics, vol. 45, No. 6, Jun. 1974.

Primary Examiner—Rolf Hille
Assistant Examiner—Minh Loan Tran T.
Attorney, Agent, or Firm—Joe E. Barbee; Stuart T. Langley

[57] ABSTRACT

A light emitting diode is provided comprising a substrate which is transparent to the emitted light upon which a plurality of semiconductor layers, including a quantum well active layer, are formed. The materials are chosen not only for their optical characteristics but also so that many of the layers act as etch stops for layers which are formed on top of them. In addition to operational semiconductor layes which form the light emitting diode, two sacrificial semiconductor layers are formed on the substrate which serve as masks during processing and are removed prior to device metallization. An initial pattern is formed in the uppermost semiconductor layer and is transferred down through lower layers using the etch stop layers and selective etches so that further photolithography steps are unnecessary. Electrodes are formed on one side of the device by conventional metal deposition techniques and are self aligned to the LED junction.

15 Claims, 3 Drawing Sheets

SELF ALIGNED, SUBSTRATE EMITTING LED

BACKGROUND OF THE INVENTION

The present invention relates, in general, to light emitting diodes. More particularly, the invention relates to self aligned light emitting diodes.

Optical data transmission systems use light emitting diodes (LED) to launch an optical data signal into a fiber optic cable. LEDs often are preferred over lasers for use in systems of this kind because of their low cost, greater ruggedness, and generally longer life.

LEDs are typically formed of a III–V compound semiconductor crystal having a direct band gap. A direct band gap allows energy to be released from the crystal in the form of a photon. In its simplest form, an LED is merely a diode formed of a direct band gap semiconductor material which, when forward biased, emits light as electrons and holes recombine near a semiconductor junction. In contrast to lasers, the light emitted from an LED is noncoherent, and comprises many modes. To remove light from the LED, the light emitting junction must be formed close to the surface so the semiconductor substrate does not absorb the generated light. Alternatively, the light emitting diode can be designed to generate light at a wavelength which passes through the semiconductor substrate, in which case the junction can be located deep within the semiconductor device. For gallium arsenide (GaAs) type devices, light having a wavelength greater than about 870 nanometers will pass through the GaAs substrate.

One problem, however, with typical LEDs is that in order to conduct current through the diode, electrical contacts have been made on both sides of the diode, thus some of the light which is generated is blocked by the electrical contact. Also, since electrical contact had to be made to both sides of the LED, mounting the LED chip so that light could be extracted was cumbersome, and fewer package configurations could accommodate the LED chip.

The cost of an LED is a function of the cost of the material used, and the cost of processing that material. In the past, light emitting diodes have required at least two photolithographic patterning steps to define the junction and the electrodes which contact the junction. Because the semiconductor materials which are used to form LEDs, such as gallium arsenide, are quite fragile, additional processing steps, particularly photolithography steps, resulted in a high percentage of wafer breakage due to handling. LED device manufacture often involved complex epitaxial processing in addition to the more common photolithography and diffusion processes. In the past, mechanical breakage combined with relatively complex epitaxial processing has made LEDs quite expensive. Additionally, since yield was difficult to predict and processing was difficult, manufacturers had a difficult time predicting cycle time and delivery schedules.

Efforts have been made to lower LED device cost by designing simpler devices which used relatively simple epitaxial structures comprising amphoteric silicon doped gallium arsenide formed by liquid phase epitaxy. Though such structures greatly simplify the equipment required to manufacture an LED, devices produced by such techniques are relatively slow. This is because amphoteric silicon doped gallium arsenide has deep acceptor levels in the gallium arsenide bandgap, which in turn increased time required for electrons and holes to recombine in the semiconductor junction.

Previous LEDs often had a portion of the semiconductor junction exposed at the surface of the device, resulting in large surface recombination currents. The surface recombination current did not generate useful light output, and served only to increase power required for the LED to operate. To achieve low current operation, surface recombination current must be minimized. Accordingly, it is an object of the present invention to provide a light emitting diode (LED) having both electrodes on a top surface.

It is a further object of the present invention to provide a light emitting diode with improved operating speed.

It is another object of the present invention to provide a light emitting diode which is less expensive to manufacture.

Another object of the present invention is to provide a method for producing a light emitting diode using a single photolithography step.

A still further object of the present invention is to provide a method for manufacturing a light emitting diode with a shorter production cycle time.

Another object of the present invention is to provide an LED having improved low current operating characteristics.

Another object of the present invention is to provide a light emitting diode which emits light primarily through a bottom surface of the diode.

SUMMARY OF THE INVENTION

These and other objects and advantages of the present invention are achieved by providing a light emitting diode comprising a substrate which is transparent to the emitted light upon which a plurality of semiconductor layers, including a quantum well active layer, are formed. The materials are chosen not only for their optical characteristics but also so that many of the layers act as etch stops for layers which are formed on top of them. In addition to operational semiconductor layers which form the light emitting diode, two sacrificial semiconductor layers are formed on the substrate which serve as masks during processing and are removed prior to device metallization. An initial pattern is formed in the uppermost semiconductor layer and is transferred down through lower layers using the etch stop layers and selective etches so that further photolithography steps are unnecessary. Electrodes are formed on the device by conventional metal deposition techniques and are self aligned to the LED junction.

DETAILED DESCRIPTION OF DRAWINGS

Figure 1:
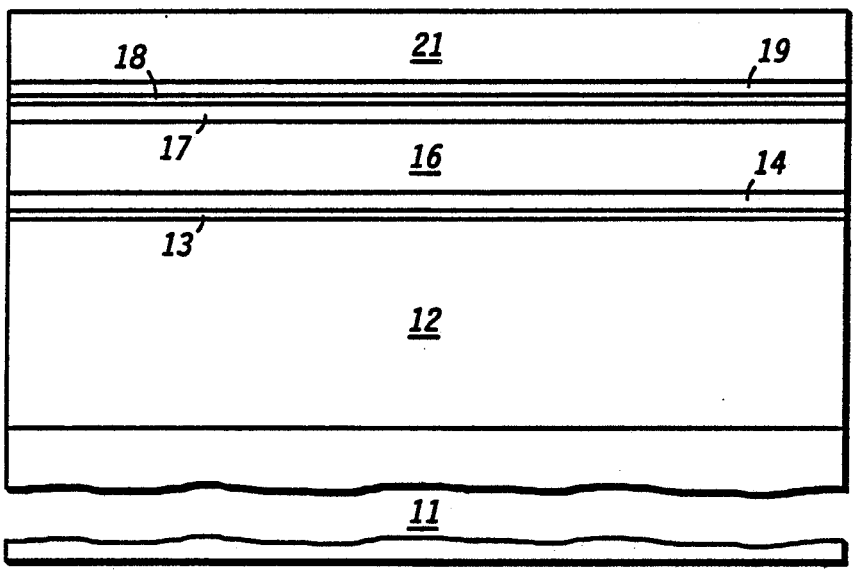
FIG. 1 is a cross sectional view of a semiconductor wafer used in the present invention after epitaxial processing.

FIG. 1 illustrates a cross sectional view of an epitaxially processed semiconductor wafer used to make the present invention. Substrate 11 may also comprise any material upon which a direct bandgap semiconductor can be epitaxially grown and may be conductive or semi-insulating. Substrate 11 must also be transparent to light wavelengths which are generated by the light emitting diode. It is believed that an N-type gallium arsenide (GaAs) substrate with a doping concentration less than $2\times10^{18}$ atoms/cm$^3$ is acceptable. Epitaxial layers 12–14, 16–19, and 21 are grown sequentially on substrate 11 in wafer form by well known epitaxial growth techniques. Preferably, semiconducting layers 12–21 are grown by metal organic chemical vapor deposition (MOCVD), but other techniques such as molecular beam epitaxy or liquid phase epitaxy may be used. For ease of description, the material properties of semiconductor layers 12–14, 16–19, and 21 will be described with reference to FIG. 1, while the function of each layer will be described in reference to FIGS. 2–7 which illustrate the manufacturing steps used to produce the LED.

Semiconductor layer 12, also known as a confinement or cladding layer, comprises P-type aluminum gallium arsenide (AlGaAs) and covers substrate 11. Confinement layer 12 is conveniently two to four microns thick, although thickness will vary over a wide range depending on desired device performance. In a preferred embodiment confinement layer 12 comprises $Al_{0.2}Ga_{0.8}As$ and is doped P-type with a dopant such as zinc at a concentration of approximately $2-10^{18}$ atoms/cm$^3$.

Active layer 13 is epitaxially grown covering confinement layer 12. In a preferred embodiment, active layer 13 comprises P-type indium gallium arsenide (InGaAs), wherein the mole fraction of indium arsenide is chosen to produce the desired wavelength of emitted light. To produce a spectral output which peaks at approximately 940 nanometers, active layer 13 comprises $In_{0.12}Ga_{0.88}As$. Active layer 13 is doped P-type with zinc and is approximately 0.01 micrometers thick. Active layer 13 is also called a strained-layer quantum well. It should be noted that since zinc is used to dope active layer 13, no deep acceptor levels exist in the band gap of the active layer, thus recombination time of the LED will be improved over devices having amphoteric silicon doped active layers which have deep acceptor levels.

Electron injection layer 14 is formed covering active layer 13 comprising aluminum gallium arsenide (AlGaAs). Electron injection layer 14 is approximately 0.2 microns thick and, for reasons described hereinafter, the aluminum mole fraction in electron injection layer 14 must be less than approximately 0.2, and is preferably 0.15. Electron injection layer 14 has a wider band gap than active layer 13, and so forms a heterojunction with active layer 13. Electron injection layer 14 is doped N-type with a dopant such as tellurium.

N-type aluminum gallium arsenide layer 16 is formed covering electron injection layer 14 and is approximately 1 micron thick. AlGaAs layer 16 must have an aluminum arsenide mole fraction of at least 0.32 and conveniently comprises $Al_{0.35}Ga_{0.65}As$.

N-type gallium arsenide (GaAs) layer 17 is approximately 0.2 microns thick and covers N-type AlGaAs layer 16. A heavily doped N+ InGaAs layer 18 is formed covering N-type GaAs layer 17. InGaAs layer 18 has a doping concentration greater than or equal to $2\times10^{18}$ atoms/cm$^3$. InGaAs layer 18, which is a contact enhancement layer in the completed device, preferably has an indium aresenide mole fraction in the range of 0.25–1.0. The thickness of the InGaAs layer 18 is about $0.01\mu m$.

InGaAs layer 18 is covered by etch stop layer 19 which comprises AlGaAs having aluminum aresenide mole fraction greater than 0.35 and a thickness of approximately 0.1 micrometers. Finally, diffusion mask layer 21 is formed covering etch stop layer 19, and is approximately 1 micron thick comprising GaAs. The conductivity type of etch stop layer 19 and diffusion mask 21 is not important as these layers will be removed before the LED is complete in processing. For this reason, etch stop layer 19 and diffusion mask layer 21 are referred to as disposable or sacrificial layers.

The epitaxially processed wafer shown in FIG. 1 may be prepared well in advance of further device processing which is described hereinafter. In this case, diffusion mask layer 21 serves to protect the underlying semiconductor layers so that the epitaxially processed wafer can be stored or warehoused for a long period of time before completing device processing. As will be seen, the additional processing required to complete the light emitting diode is greatly simplified and streamlined compared to prior art processes. The ability to store wafers which can be processed into completed devices within a few days greatly improves the manufacturers flexibility in production planning and control.

Figure 2:
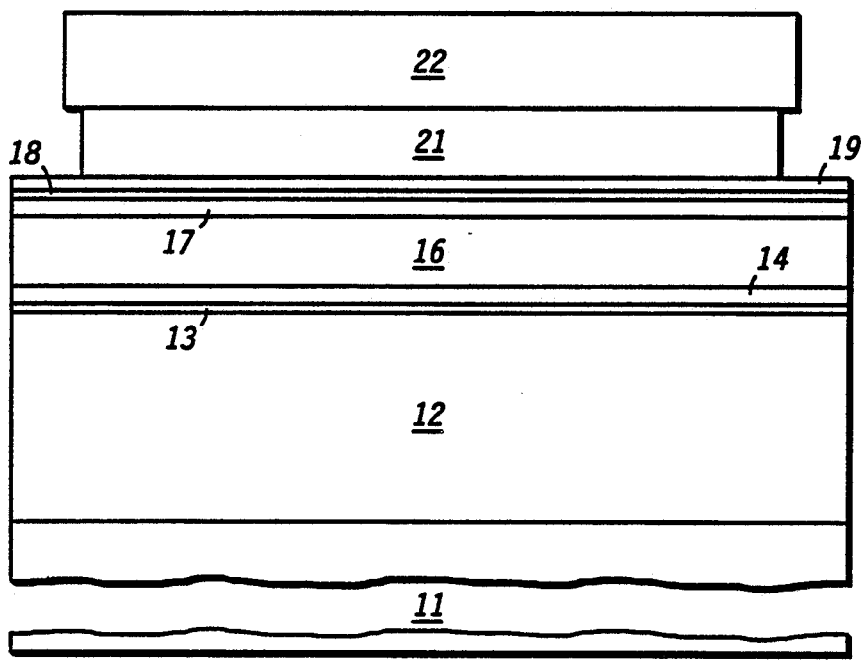
FIGS. 2–7 illustrate cross sectional views of the present invention at various stages of processing.

FIG. 2 illustrates a cross sectional view of the light emitting diode processed through photoresist and etch of diffusion mask layer 21. A photoresist layer is applied covering the surface of diffusion mask layer 21, and patterned to form photoresist mask 22. Diffusion mask layer 21 is etched using an etchant such as peroxide-ammonia (PA) which will etch GaAs, but not etch AlGaAs. Thus the etch will stop uniformly on etch stop layer 19 which comprises AlGaAs. Alignment for photoresist mask 22 is not critical because it is the only photomask used to produce the device of the present invention, and all other structures are self aligned to the initial pattern formed by photomask 22.

Figure 3:
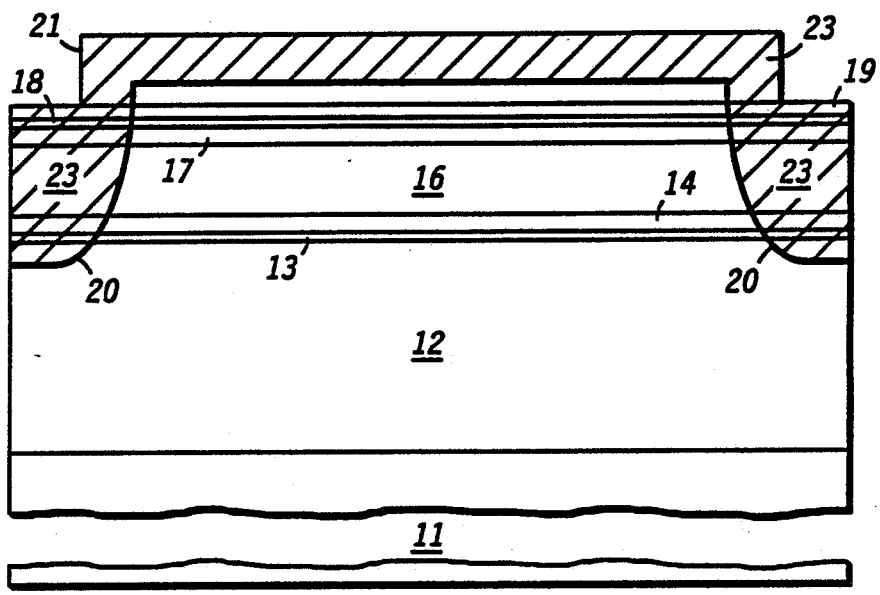

FIG. 3 illustrates the cross sectional view of the device further along in processing. A P-type diffusion is performed over all the exposed surfaces of the device including diffusion mask layer 21 and etch stop layer 19. The diffusion profile is illustrated in FIG. 3 by heavy line 20 and shaded regions 23. Diffused regions 23 extend vertically to confinement layer 12 and eventually determine the lateral position of the PN junction which forms the light emitting diode. Separation between diffused regions 23 determines the spot size of the completed light emitting diode. Although diffusion profiles 20 are illustrated as uniform curves, some distortion will occur in the shape because Zn diffuses approximately four to five times faster in AlGaAs than in GaAs. This distortion does not affect device performance.

Figure 4:
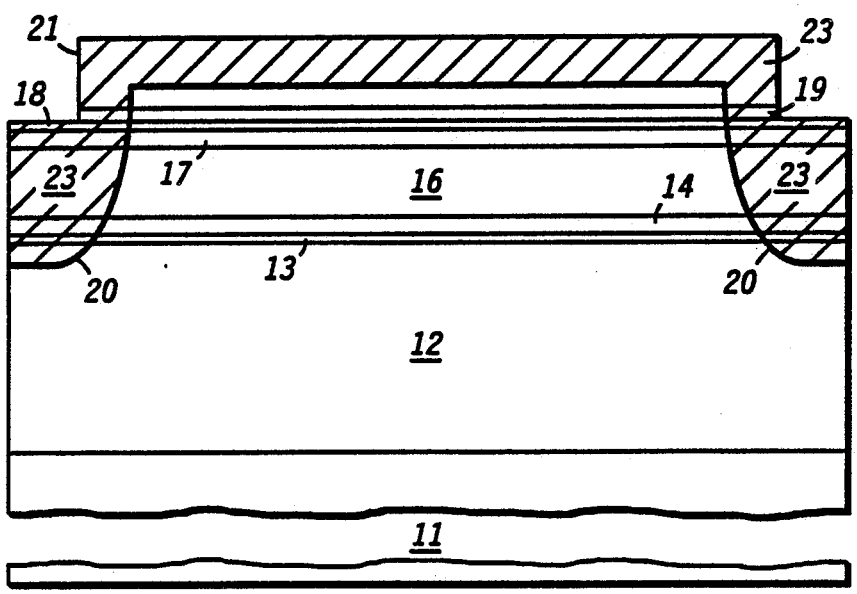

FIG. 4 illustrates the light emitting diode further along in processing. A portion of etch stop layer 19 which lies outside the lateral boundaries of diffusion mask layer 21 is etched in a hydrofluoric acid (HF) etch. The HF etch will attack AlGaAs, but will not etch InGaAs and GaAs, so diffusion mask 21 serves as a mask for the HF etch. InGaAs/GaAs bilayer 18 and 17 serve as an etch stop for the HF etch, thus protecting AlGaAs layer 16 during the etch.

Figure 5:
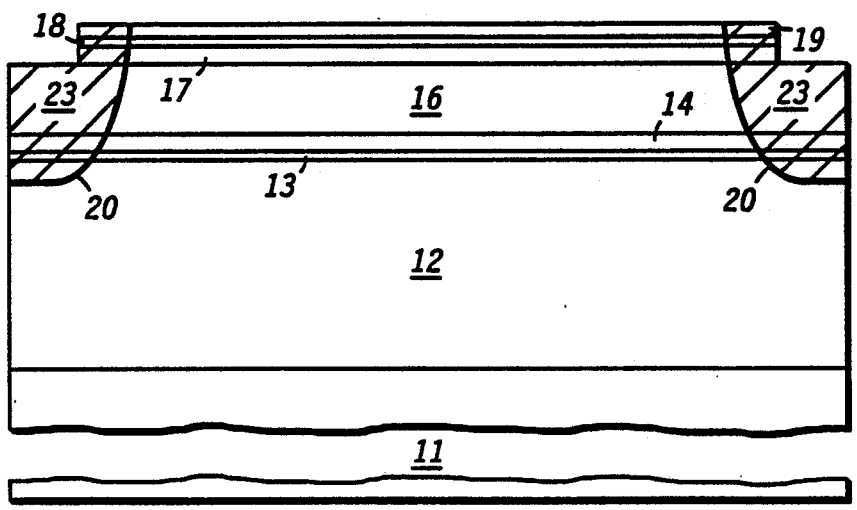
Figure 6:
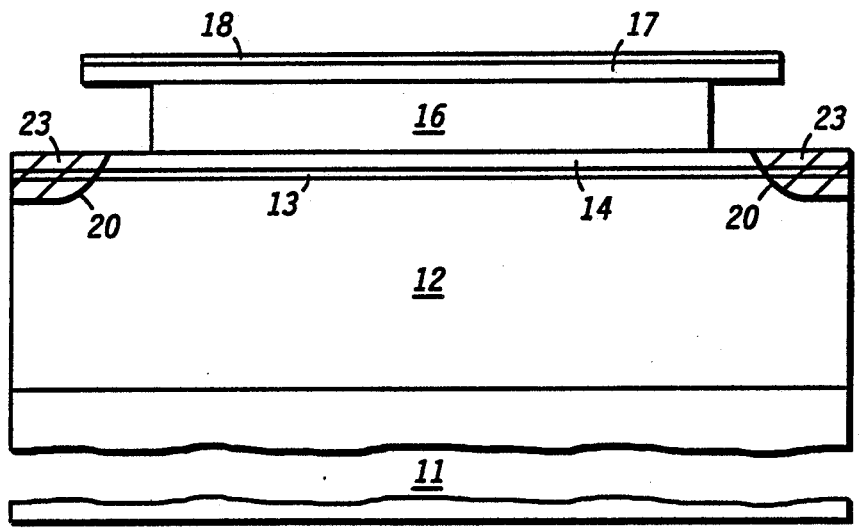

FIG. 5 illustrates the cross sectional view of the device after a second PA etch. The PA etch completely removes diffusion mask layer 21 and portions of the InGaAs/GaAs bilayer 18 and 17 which is exposed by etch stop layer 19. The PA etch will not etch AlGaAs, so AlGaAs layer 16 is not attacked during the etch. Next the device is once again etched in a HF etch which removes the exposed portions of AlGaAs layer 16. Electron injection layer 14 has an aluminum mole fraction less than 0.20, which is low enough that it does not etch in the second HF etch which etches AlGaAs layer 16. Thus, AlGaAs layer 16 can be overetched so that an undercut is formed as shown in FIG. 6. In this manner, AlGaAs layer 16 forms a pedestal which separates electron injection layer 14, and P-type diffused region 23 from GaAs layer 17 and contact layer 18. The second HF etch completely removes etch stop layer 19 thus exposing contact layer 18.

Figure 7:
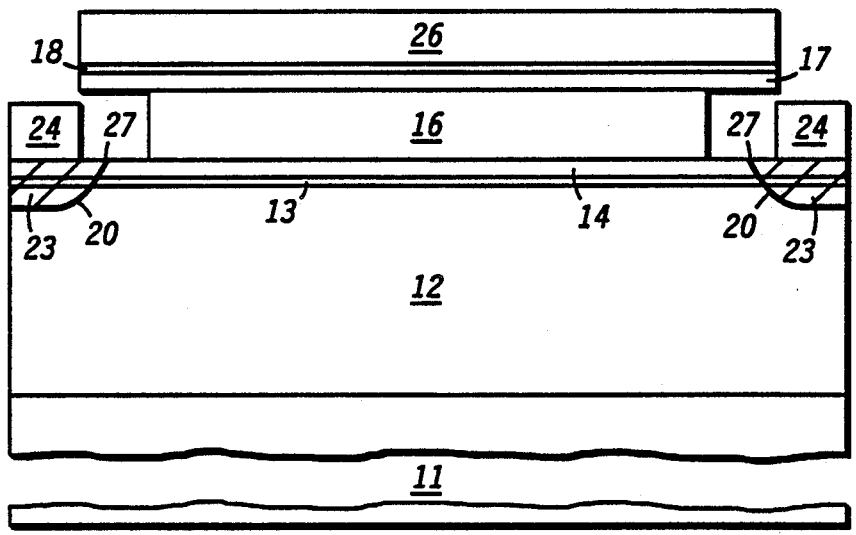

Referring now to FIG. 7, the device is completed by forming electrodes 24 and 26 simultaneously. The zinc diffusion which forms diffused regions 23 must extend laterally underneath the shelf which is formed by GaAs layer 17 and contact layer 18. Because diffused region 23 extends underneath the shelf formed by GaAs layer 17 and contact layer 18, electrodes 24 and 26 can be formed in a single metal deposition without a photoresist patterning step required. Also, both electrodes are formed on the top side of the chip so that light emitted from the bottom side is unobstructed. Electrodes 24 are thus coupled to confinement layer 12, or the P side of the junction through diffused regions 23. Electrode 26 is coupled to the N type portion of electron injection layer 14 also called the N side of the junction.

As can be seen, an epitaxially processed substrate as shown in FIG. 1 can be completed with one photolithography step, one diffusion, and four etches. Manufacture is also simplified because the four etches require only two etch solutions so the manufacturing process can be highly automated and would require minimum capital expenditure. Also, because the depth of each etch is controlled by etch stop layers which are built into the epitaxial substrate, process control is greatly enhanced improving product uniformity and quality.

The light emitting diode shown in FIG. 7 offers additional functional benefits over previous light emitting diodes. Electron injection layer 14 has a wider bandgap than active layer 13 and thus serves to confine current in active layer 13. A portion of the PN junction formed by diffused region 23 and electron injection layer 14 must be exposed at the surface shown generally at 27. The exposed junction occurs in a wide bandgap material thus greatly reducing surface recombination and improving low current performance of the device. Additionally, the lattice disordering caused by zinc diffusion into the InGaAs active layer further reduces surface recombination, thus further improving low current performance. The lattice disordering caused by the zinc diffusion creates a wider bandgap InAlGaAs layer outside of the InGaAs active emission region which was not zinc diffused. Thus, there is a lateral optical and electrical confinement surrounding the InGaAs active emission region; thereby, providing a more efficient device. In operation, current flows from electrode 26 through contact layer 18 and GaAs layer 17, through pedestal 16 to the N-type portion of electron injection layer 14. Electrons are injected into active layer 13 where they recombine with holes, thereby producing a light which is emitted through the bottom of substrate 11. Active layer 13 acts as a lambertian light source, that is to say that light is emitted in all directions and spreads as it travels through substrate 11.

On the P-side of the junction, current flows from electrodes 24 through P-type doped portions of electron injection layer 14 and active layer 13 to confinement layer 12. Current spreads in confinement layer 12 due to the comparatively low resistivity of the thick layer so that as carriers turn upwards towards the junction a uniform current density is established. Uniform current density results in higher reliability and uniform light generation in active layer 13. Thickness and resistivity of confinement layer 12 can be modified to achieve a desired uniformity of current density and light output.

By now it should be appreciated that a light emitting diode is provided with improved operating characteristics, particularly at low current. The light emitting diode provided is manufactured using a complex epitaxial substrate which includes active layers, etch stop layers, and disposable or sacrificial layers. Using the complex epitaxial layer improves process flexibility and decreases process cycle time, while at the same time reducing cost of the chip. Higher frequency of operation is obtained by using dopants which produce shallow acceptors in the gallium arsenide bandgap. A method for manufacturing the LED is provided wherein one photoresist step is used and all other structures are self aligned to that initial photomask, and a single diffusion and four etches are used to form the finished light emitting diode.

We claim:

1. A light emitting semiconductor device comprising: a substrate having a first and a second surface wherein the substrate is substantially transparent to the emitted light and the first surface is compatible with epitaxial growth of a direct band gap semiconductor; a p-type AlGaAs layer covering the first surface of the substrate; a p-type InGaAs layer covering the p-type AlGaAs layer; a first n-type AlGaAs layer covering the p-type InGaAs layer; a second n-type AlGaAs layer covering a portion of the first n-type AlGaAs layer; an n-type GaAs layer covering the second n-type AlGaAs layer and having an overhanging portion which extends beyond the second n-type AlGaAs layer; an n-type InGaAs layer covering the n-type GaAs layer; and a p-type diffused region extending from a portion of an exposed surface of the first n-type AlGaAs layer, through the p-type InGaAs layer and into the P-type AlGaAs layer having a lateral boundary which is beneath the overhanging portion of the GaAs layer.

2. The light emitting semiconductor device of claim 1 wherein the substrate comprises N-type GaAs having a doping concentration less than $2 \times 10^{18}$ atoms/cm$^3$.

3. The light emitting semiconductor device of claim 1 wherein the p-type AlGaAs layer comprises $Al_{0.2}Ga_{0.8}As$ having a thickness in the range of 2 to 4 microns.

4. The light emitting semiconductor device of claim 1 wherein light is emitted principally from the second surface of the substrate.

5. The light emitting semiconductor device of claim 1 further comprising a first electrode formed in contact with the p-type diffused region and a second electrode in contact with the n-type InGaAs layer.

6. The light emitting semiconductor device of claim 1 wherein the p-type dopant comprises zinc.

7. The light emitting semiconductor device of claim 1 wherein the emitted light is non-coherent, and is emitted in several directions.

8. The light emitting semiconductor device of claim 1 wherein a peak wavelength of emitted light is substantially 940 nanometers.

9. A semiconductor wafer used to make a light emitting diode comprising: a substrate having first and second surfaces wherein the substrate is transparent to the emitted light and the first surface is compatible with epitaxial growth of a direct bandgap semiconductor; and a p-type AlGaAs layer, a p-type InGaAs layer, a first n-type AlGaAs layer which serves as an electron injection layer, a second n-type AlGaAs layer, an n-type GaAs layer, an n-type InGaAs layer, an AlGaAs etch stop layer, and a GaAs sacrificial layer sequentially formed on the substrate.

10. A light emitting semiconductor device comprising: a GaAs substrate having first and second surfaces; a p-type cladding layer formed on the first surface of the GaAs substrate; a p-type active layer formed on the cladding layer comprising a direct bandgap semiconductor wherein the active layer emits light when electrons are injected into it; an n-type electron injection layer formed on the active layer and having a wider bandgap than the active layer and the cladding layer; an n-type pedestal formed on a portion of the n-type electron injection layer; a p-type diffused region surrounding the pedestal and spaced from the pedestal extending vertically into the cladding layer; an n-type GaAs layer covering the pedestal; an n-type contact layer formed on the n-type GaAs layer; a first electrode coupled to the contact layer; and a second electrode coupled to the p-type diffused region.

11. The light emitting semiconductor device of claim 10 wherein the GaAs substrate is transparent to the emitted light.

12. The light emitting semiconductor device of claim 11 wherein a peak intensity of the emitted light occurs at a wavelength greater than 870 nanometers.

13. The light emitting semiconductor device of claim 10 wherein the active layer is approximately 0.01 micrometers thick and comprises $In_{0.12}Ga_{0.88}As$.

14. A light emitting diode comprising: a first semiconductor layer comprising AlGaAs of a first conductivity type which serves as a confinement layer; a second semiconductor layer of the first conductivity type covering the first semiconductor layer which serves as an active layer, wherein the second semiconductor layer has a narrower bandgap than the first semiconductor layer and comprises a material with a direct bandgap; a third semiconductor layer comprising AlGaAs of a second conductivity type covering the second semiconductor layer which serves as an electron injection layer; a pedestal comprising a semiconductor of the second conductivity type formed on a portion of the electron injection layer; a fourth semiconductor layer of the second conductivity type covering the pedestal and having an exposed heavily doped surface; a diffused region formed in another portion of the electron injection layer and extending vertically to the confinement layer; a first electrode coupled to the diffused region; and a second electrode coupled to the pedestal through the fourth semiconductor layer.

15. The light emitting diode of claim 14 wherein the second electrode extends laterally beyond the pedestal.

* * * * *